(12) United States Patent
Gao (10) Patent No.: US 11,202,378 B1
(45) Date of Patent: Dec. 14, 2021

(54) MODULAR INFRASTRUCTURE FOR COMPUTE AND STORAGE CLUSTERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/943,620

(22) Filed: Jul. 30, 2020

(51) Int. Cl.
| | |
|---|---|
| G06F 1/16 | (2006.01) |
| H05K 5/00 | (2006.01) |
| H05K 7/00 | (2006.01) |
| H05K 5/02 | (2006.01) |
| H05K 7/20 | (2006.01) |
| H05K 7/14 | (2006.01) |

(52) U.S. Cl.
CPC ......... *H05K 5/0065* (2013.01); *H05K 5/0291* (2013.01); *H05K 7/1427* (2013.01); *H05K 7/1487* (2013.01); *H05K 7/1492* (2013.01); *H05K 7/20* (2013.01)

(58) Field of Classification Search
CPC .. H05K 5/0065; H05K 5/0291; H05K 5/0026; H05K 5/0286; H05K 5/0256; H05K 7/20; H05K 7/1427; H05K 7/1487; H05K 7/1492; H05K 7/1429; H05K 7/1431; H05K 7/1485
See application file for complete search history.

(56) References Cited

U.S. PATENT DOCUMENTS

| | | | |
|---|---|---|---|
| 10,966,339 B1* | 3/2021 | Gardner | G06F 1/187 |
| 2004/0221084 A1* | 11/2004 | Yates | G01R 31/31907 710/305 |
| 2011/0261526 A1* | 10/2011 | Atkins | H05K 7/1487 361/679.33 |
| 2011/0304966 A1* | 12/2011 | Schrempp | G06F 1/186 361/679.4 |
| 2012/0151098 A1* | 6/2012 | Sullivan | H05K 1/14 710/13 |
| 2013/0308265 A1* | 11/2013 | Arnouse | H05K 7/20709 361/679.41 |
| 2015/0289405 A1* | 10/2015 | Stewart | H05K 7/183 211/26 |
| 2017/0228339 A1* | 8/2017 | Shao | G06F 13/4282 |
| 2018/0228057 A1* | 8/2018 | Beall | G11B 33/142 |

\* cited by examiner

*Primary Examiner* — Anthony M Haughton
(74) *Attorney, Agent, or Firm* — Womble Bond Dickinson (US) LLP (57) ABSTRACT

A computing and storage system includes a housing having power and cooling facility and a plurality of slots, each slot having interface connection. An interconnecting board is coupled to the interface connection of the plurality of slots. A plurality of baseboards are inserted, each in one of the slots wherein a board interface mates with the interface connection. All of the baseboards have the same form factor and the same board interface and each of the baseboards has a plurality of electronic devices, such that all of the electronic devices mounted onto one of the baseboards are the same. Using the interconnecting board, the various baseboards can be interconnected to form a computing and/or storage machine of different operational characteristics as required by a given task. In addition, the inter connection board is managed to adjust the networking resource allocations for different traffic characteristics and workload requirements.

20 Claims, 8 Drawing Sheets

MODULAR INFRASTRUCTURE FOR COMPUTE AND STORAGE CLUSTERS

FIELD OF THE INVENTION

Embodiments of the present invention relate generally to electronic system. More particularly, embodiments of the invention relate to architecture for compute and storage hardware and packaging that is generally installed in data centers.

BACKGROUND

With business models developing and changing rapidly, especially in the AI and cloud computing areas, the traditional compute and storage infrastructure may not be able to continue to support, or efficiently support, the workload requirements. New programs requires faster and faster computing performance and capability, larger and larger data storage capacity, more and more powerful data moving throughput. With the slowing down of Moore's Law, single chip and component performance has already reached their performance bottle neck for operating in these workload environments, even though the capabilities of a single chip is still increasing with more and more cores. Therefore, scale-out is a key focus for solving this challenge.

Software is much more dynamic than hardware, and therefore it is very challenging to develop one or even several common hardware systems or platforms to support all types of software or business workloads. This means that some of workload running on the hardware system and platform are compute intensive, some of the workload are storage intensive, and some of the workload are more sensitive with the communication bandwidth. A traditional server package method and configuration may no longer be appropriate or may no longer be efficient or cost effective for operating new type of workloads in the future. Moreover, upgrading by addition additional server capacity is inefficient, as not all of the components included in the new servers are required for the additional performance sought.

Data centers generally are composed of hundreds or thousands of servers and related operational equipment. These servers are interconnected to provide computing and storage facilities to subscribers. Each of these servers houses a prescribed amount of CPU, GPU, ASIC, DIMM, SSD or HHD, etc. When capacity increase is needed, additional server units can be added, each with its own prescribed amount of CPU, GPU, ASIC, DIMM, SSD or HHD. The addition of servers also requires the addition of facility equipment, such as power and cooling equipment. However, such an approach to capacity expansion is inefficient.

Accordingly there's a need for a new architectures that enables a more efficient utilization of compute and storage hardware and resources, and a more efficient form of repurposing or capacity expansion.

BRIEF DESCRIPTION OF THE DRAWINGS

Embodiments of the invention are illustrated by way of example and not limitation in the figures of the accompanying drawings in which like references indicate similar elements.

FIG. 6 illustrates an example of a cluster design for heterogeneous computing according to an embodiment, while

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The following detailed description provides examples that highlight certain features and aspects of the innovative modular architecture claimed herein. Different embodiments or their combinations may be used for different applications or to achieve different results or benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The current disclosure introduces a modular design and architecture that enables easy configuration, repurposing and capacity expansion of computing, storage and interconnection/networking resources. Aspects of the disclosure provide a uniform architecture that can accommodate various devices to satisfy different computing and storage requirements as needed by users. In disclosed embodiments the amount of CPU, GPU, ASIC, DIMM, SSD or HHD, etc., available can be easily configurable.

As will be revealed from the disclosure provided herein, a novel design concept is introduced for designing and configuring compute and storage clusters for cloud, AI, and high performance computing related applications. The disclosed infrastructure provides dynamic configurations for the compute and storage clusters. In the disclosed embodiments the clusters can be easily reconfigured or upgraded using different compute and storage systems, including components such as the CPU, memory, SSD and high performance accelerators, ASIC, and networking equipment. This enables designing different large scale systems or clusters tailored for different applications, workload and traffic types. The hardware components are segregated in groups, but are interconnected with high speed intra-system (within baseboard) and inter-system (between baseboards) connections. All the baseboards have a uniform configuration in terms of form factor and interface. In one embodiment, the baseboards may follow more than one reference design with standard specifications. Standard power and cooling infrastructure is integrated into the system and can be flexibly reconfigured based on use cases.

Generally, in disclosed embodiments the entire cluster may be considered as a large modular computer system, and the design enables reconfiguring the internal devices to form different types of computers, such as a computing intensive machine, storage intensive machine, heterogeneous computing machine, application specific machine, and so on. The infrastructure includes several major components, such as component baseboards, IT container, interconnecting board, cooling and power module, etc. The infrastructure and development method provide an efficient and cost effective means to design, build and deliver customized computing and storage clusters. In addition, the infrastructure can be flexibly reconfigured based on use case or any other requirement variations. In another embodiment, the cluster can have different generations of the components, or mixed with high end processors and low end processors, or systems. This provides more flexibility for operating different services and workloads with more cost effective infrastructure. In other embodiments, the current infrastructure can be deployed with different memory hierarchy design.

It is becoming more and more important to develop compute and storage segregated infrastructure for high resilience requirement especially in cloud computing. In the embodiments disclosed herein, a segregated platform is provided that enables easy upgrade, easy reconfiguration, and easy repurposing of computing resources. Since the embodiments segregate the computing components, each component may be retired, changed, upgraded, and reconfigured with other components to satisfy different user requirements and environment demands.

Figure 1:
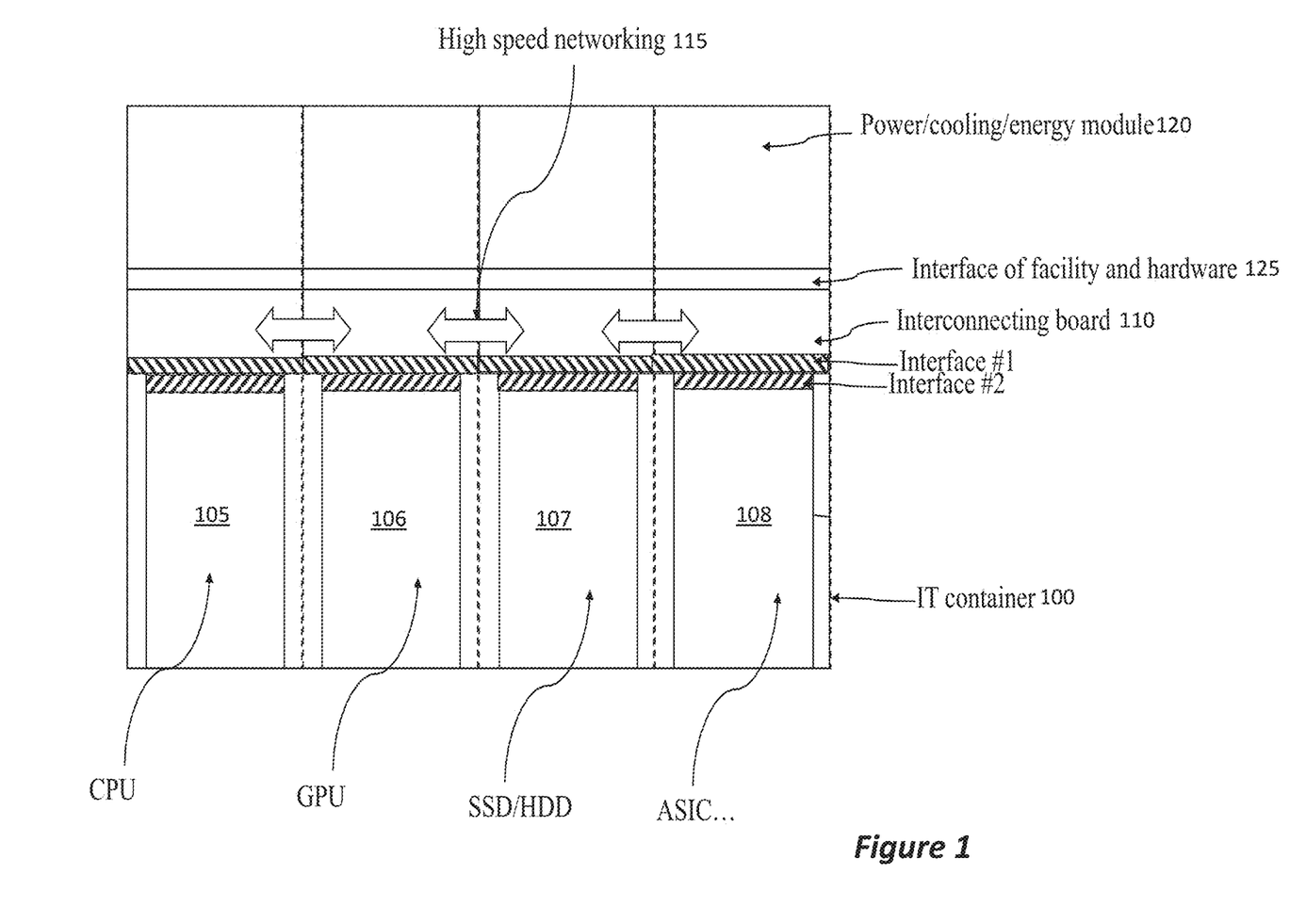
FIG. 1 is a block diagram illustrating an example of system architecture according to an embodiment.

FIG. 1 illustrates a top view of system architecture according to one embodiment. A uniform baseboard 105-108 is used for packaging different types of components such as CPU, GPU, SSD/HDD, FPGA, ASIC, and so on. The baseboard may be fabricated using a PCB of a given standardized size and including standardized mounting attachments and interface. Thus, any baseboard may be mounted onto any of the baseboard slots in the IT container 100. In that sense, the baseboards are uniform, as they all have the same form factor, power delivering design, cooling requirement, mounting attachments, and interface.

In the disclosed embodiment, each of the uniform boards 105-108 is structured to mount multiple components of the same type, but all of the uniform baseboards have the same form factor and the same interface, indicated as interface #2 in FIG. 1. For example, baseboard 105 is configured for mounting multiple CPU's, while baseboard 106 is configured for mounting multiple GPU's; however, both have same form factor and interface, so that they can be interchanged. Internally, each type of baseboard may have different interconnect topology or PCB trace and routing design to accommodate the type of components that are designed to be mounted thereupon. Note also that since each baseboard may carry only one type of component it cannot function independently, but must be interconnected to other baseboards in order to execute a task. It needs to be mentioned that some of the baseboards may also be packaged with some other specific chips such as a CPLD (Complex Programmable Logic Device) for fundamental control and management functions.

To clarify, consider the layout of a standard motherboard. It would have one or more sockets for CPU, one or more sockets for GPU, DIMM memory slots, PCIe slots, ATX connector, SATA connectors, etc. In essence, once the motherboard is powered, it is fully functional and can perform computing tasks. Conversely, in the disclosed embodiments each of the baseboards has multiple sockets, slots or connectors for only one type of component. So, for example, a CPU baseboard would have multiple CPU sockets, but all which can accept only a CPU chip. No other component can be mounted onto the CPU baseboard, other than components needed to power and run the CPU. Similarly, a memory baseboard may have multiple DIMM slots, but no other types of sockets or slots. Consequentially, a baseboard is not functional and cannot perform any computing tasks unless it is connected to other baseboards.

Turning back to FIG. 1, the IT container 100 may be a cabinet, enclosure or housing, somewhat akin to an IT rack, having plurality of slots configured to house a plurality of baseboards. The IT container 100 incorporates an interface, indicated as interface #1 in FIG. 1, which accepts the baseboards via interfaces #2. That is, the board interface (interfaces #2) of each baseboard mates with the IT container 100 interface (interfaces #1). Interface #1 is coupled to or forms part of interconnecting boards 110 that interconnects the baseboards. Interface #1 and interconnecting boards 110 form high speed networking 115, and may include InfiniBand (IB), Ethernet, RDMA (Remote Direct Memory Access), etc. The high speed networking 115 enables each component from one baseboard to communicate with any other component in other baseboard, either fully connected or connected under specific control and management design. This control and management design enable to manage the traffic more efficiently given the interconnection and networking resource within a cluster.

The IT container 100 also includes facilities equipment 120 that provides power and cooling to the baseboards and the high speed network 115 via facility interface 125. The facilities equipment 120 may include battery backup and air and/or liquid cooling equipment. These units are modularized and could be serviced independently, or be upgraded without impacting any of the services running on the cluster—generally referred to as hot swappable.

With the architecture illustrated in FIG. 1, each IT container 100 may be easily configured and reconfigured as needed to provide specific performance characteristics to address specific tasks. For example, for highly computing intensive tasks, an IT container may be loaded with a high number of CPU baseboards 105, while being light on the other types of baseboards. Conversely, for a backup solution, an IT container 100 may be loaded mostly with SSD/HDD baseboards 107. As another example, for AI applications and tensor intensive processing, the IT container 100 may be heavily loaded with GPU baseboards 106 only or storage components 107 only. Moreover, since the form factor and interface of all of the baseboards is the same, an IT container 100 configured for one task, can be easily repurposed or upgraded by simply replacing the baseboards as needed.

Since the cooling and power are modular, it is easier to configure different types of method or architecture based on the requirements of baseboards 105-108. For example, considering the baseboards 105-108 installed in different IT containers. Some of the IT containers may require liquid cooling solutions, while the remaining containers may require air cooling. Similarly, some IT containers may require 48V power delivery system while other IT containers may require 12V power delivery system. In such cases the power module and cooling module can be configured easily and efficiently to satisfy these different requirements.

The architecture illustrated in FIG. 1 provides enhanced efficiency in utilizing computing and memory components. To illustrate, consider a standard IT rack having a plurality of motherboards, each with a socket for CPU, two DIMM slots with RAM chips, two PCI slots with ASIC chips, a Northbridge chipset, a Southbridge chipset, etc. Consider that the IT rack is to be upgraded to provide higher computing facility, e.g., ten more CPU's are needed. Then, ten more motherboards need to be added to the IT rack. However, this upgrade also adds ten times of: two DIMM slots with Ram chips, two PCI slots with ASIC chips, a Northbridge chipset, a Southbridge chipset, etc. These additional components were not needed and would not be utilized to their fullest potential, thus the upgrade is inefficient.

Consider now an upgrade to the IT container 100. To add ten CPU's one simply needs to add one CPU baseboard 105 having ten CPU's mounted thereupon, or two CPU baseboard 105 having five CPU's mounted on each, etc. That is, since only additional CPU's are needed, only CPU's are added. Such an upgrade is much more efficient than the traditional motherboard architecture.

The embodiment shown in FIG. 1 is not only convenient for hardware upgrading and system upgrading, but also enables utilizing the hardware resources in high efficiency. Once the hardware is assembled and connected in the system, it shares all the resources (compute, storage and networking) with all the other components within the cluster. The resource pooling enables each component to participate in completing a work or task with any other component using the most efficient communication and connection, controlled and scheduled by the system.

It should be appreciated that with the provision of the high speed networking 115, the IT container 100 as a whole can perform any computing or storage task. While, each of the baseboards by itself cannot perform any task, since it may communicate with any other component within the IT container 100, any task may be executed by the collective components loaded onto the IT container 100. Thus, while the various individual components have been segregated into different baseboards, the totality of components have been aggregated by mounting the baseboards onto the IT container 100 and providing the high speed network 115. Moreover, the high speed networking 115 provides communication facility to other IT containers, such that multiple IT containers can address a given task together.

Figure 2:
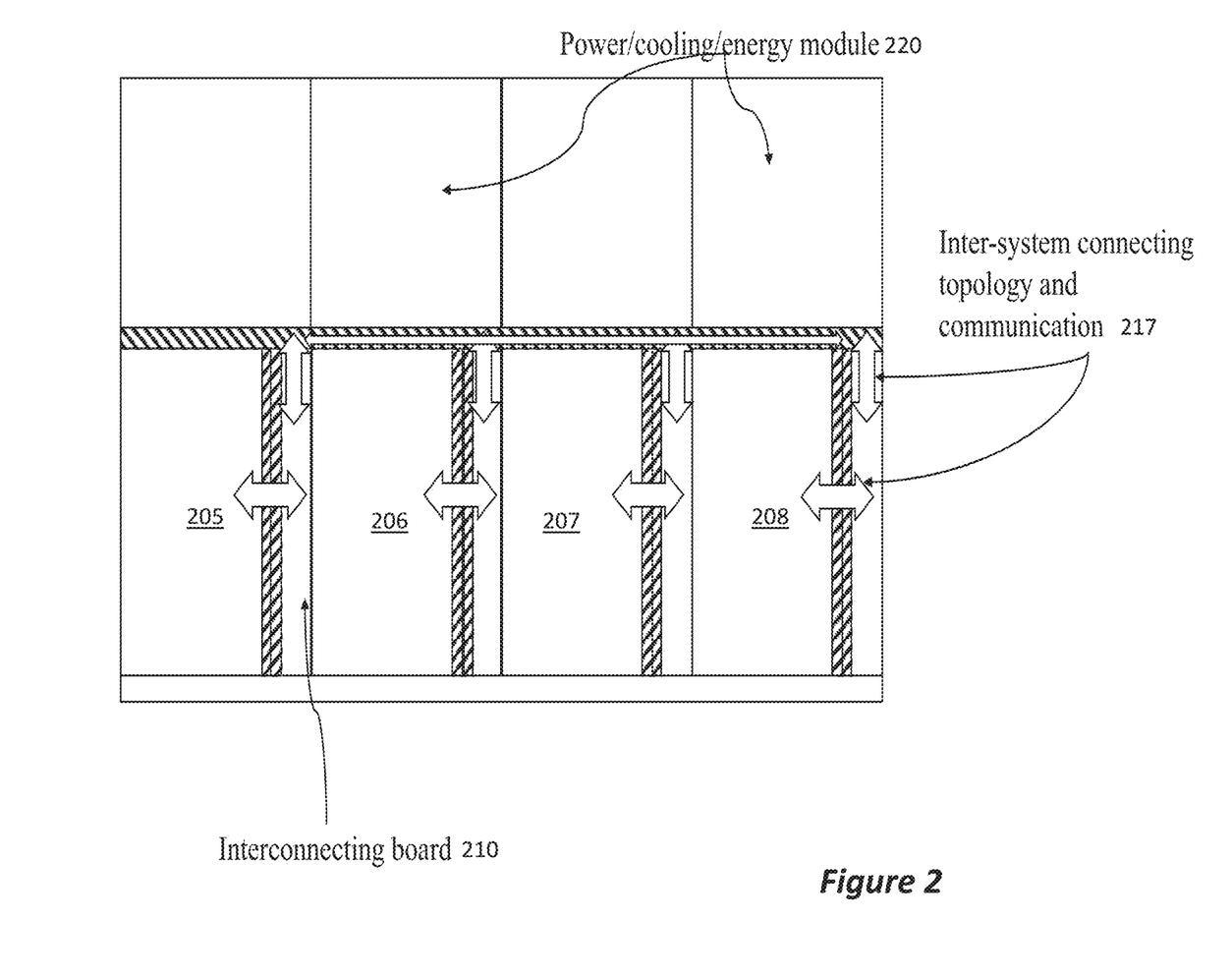
FIG. 2 is a block diagram illustrating an example of another system architecture according to an embodiment.

FIG. 2 illustrates another embodiment of modular system architecture that can be easily reconfigured and upgraded as needed. The embodiment of FIG. 2 is somewhat similar to that of FIG. 1, except that interconnecting boards 210 are provided between baseboards 205-208, forming inter-system connecting topology and communication 217. While the general form factor and interface of baseboards 205-208 may be different from that of baseboards 105-108, the general structure is the same, in that all baseboards 205-208 have the same form factor and interface, so that they are interchangeable.

In the embodiment illustrated in FIG. 2, the interconnecting board 210 is used on the side of each baseboard, and the interfaces are designed on the side of the baseboards. The connecting topology may be provided by the interconnecting boards located in two sides of each baseboard. In such manner, the power and cooling module can be directly attached to the rear side of the IT container to complete a full functioning module.

Figure 3A:
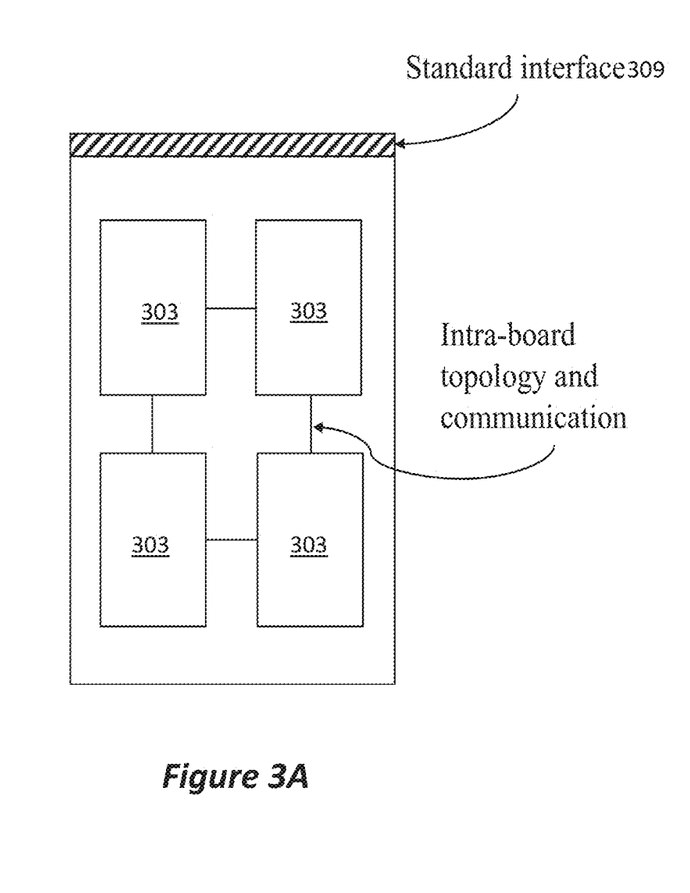
FIGS. 3A and 3B are block diagrams illustrating examples of component packaging configuration according to disclosed embodiments.
Figure 3B:
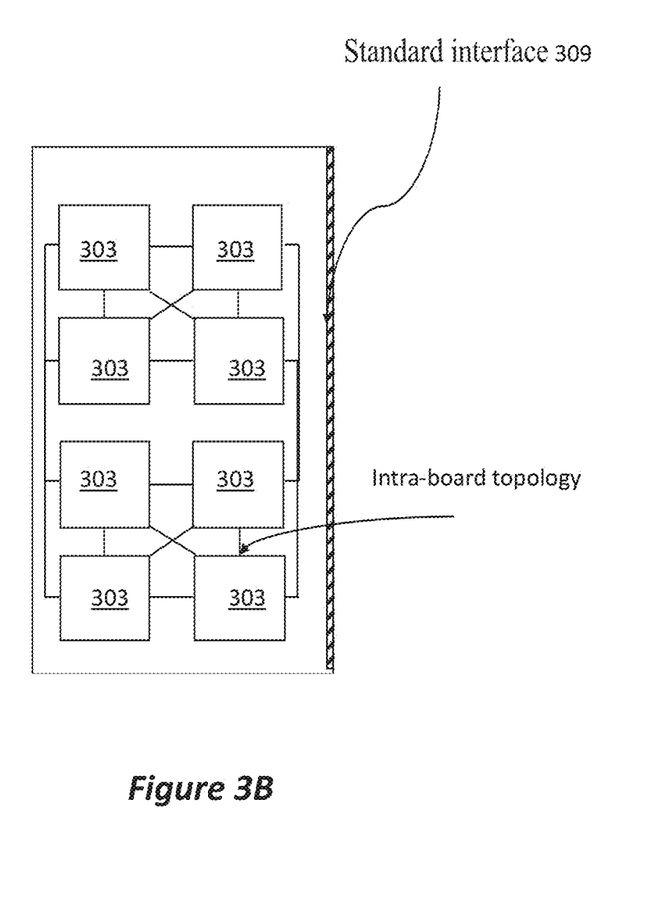

FIGS. 3A and 3B illustrate two examples for baseboards, each dedicated for one type of components or chipsets. The intra-board connecting topology and communication can be designed for the specific components to be mounted on the board. Each type of component or chipset may have different protocol and or communication throughput requirements, such as CCIX, PCIE, CXL, etc. Therefore, a different internal design of the baseboard enables it to become dedicated to that particular component, such that the dedicated baseboard provides the best functioning environment for that particular component or chipset. While some components may require proprietary discovery protocol, others may function properly using vendor neutral protocol, e.g., Link Layer Discovery Protocol (LLDP). Similarly, while some components may use Unidirectional Link Detection (UDLD), a D-Link proprietary component would require DULD (D-Link Unidirectional Link Detection). Thus, the internal design of each baseboard may be optimized for the specific type, brand and/or model of components that it is designed to support.

To visually illustrate this feature, the connecting traces shown in FIG. 3A (Intra-board topology) differ from those illustrated in FIG. 3B. Also, the number and type of sockets or slots 303 may differ, to accommodate the devices to be mounted. However, on each baseboard all of the sockets or slots 303 are the same and the interconnecting traces are the same. Also, the standard interface 309 is also the same for all of the baseboards. The standard interface consists of many connectors, such as I/O, PCIe (peripheral component interconnect express) connectors, power and cooling. All the connectors are packaged in this interface portion. In another embodiment, the power and cooling interface and connections maybe separated.

Figure 4:
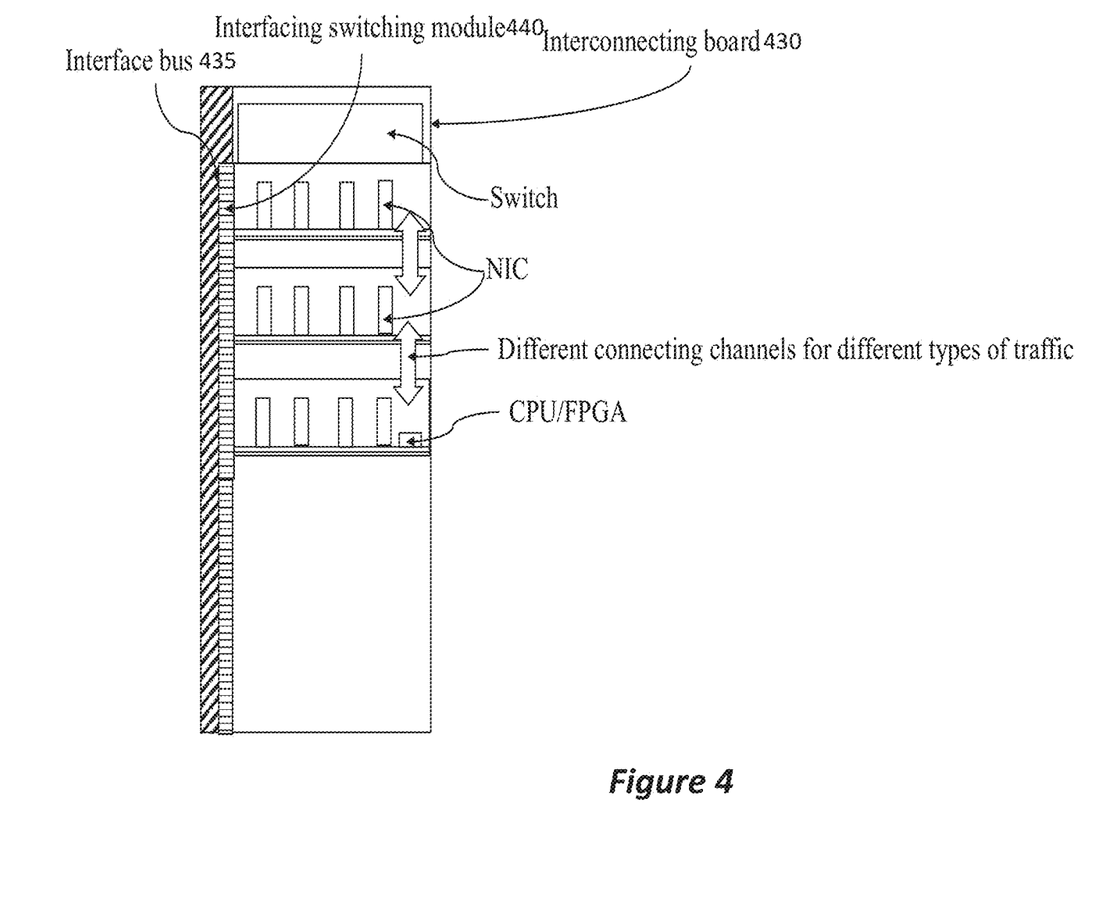
FIG. 4 illustrates an example of a high speed interconnecting board according to an embodiment.

FIG. 4 illustrates an embodiment of the IT container in a front view. As indicated in the above description, an important element to enable the disclosed architecture is the high-speed communication network between the various baseboards. In this embodiment, a high speed interconnecting board 430 provides the high speed interconnection among the baseboards and operates with the interface bus 435 and interfacing switching module 440. The interface bus 435 carries communication traffic among all the different types of baseboards. The interfacing switching module 440 is used for controlling and switching the interconnections among the baseboards and the interconnecting board.

One embodiment of the high speed interconnecting board 430 is assembled with multiple networking devices and equipment, such as NICs (Network Interface Cards) and switches. Within the interconnecting board, each of the NIC boards are interconnected, this means that any single NIC card can access the other components packaged within the interconnecting board. Since the networking devices are interconnected with each other, and different type of connecting channels can be controlled for different types of traffic and data flow. By including networking devices of different performance characteristics, different communication channels can be generated to service different tasks or perform different communication topologies. The different communication channels can provide different levels of service.

In some embodiments, some of the interconnecting boards may be assembled with additional computing and/or storage units. For example, the interconnecting board may incorporate local computing components, such as CPU, FPGA, memory, etc., that can be accessed directly by different systems at different times based on use cases, and may be available to any of the NIC components. The design of this unit can be customized and uniquely configured by the end user. In some examples, the local computing and/or storage components can be used to perform some local computing tasks instead of or prior to directing the task to one of the baseboards.

To provide a concrete example, of how some computing can be offloaded to the local computing components, consider video transcoding. When a large video stream is received, the system can transcode the video stream using the local computing components. In one example, the local computing components can run an algorithm to efficiently determine which video is popular and should be stored in multiple copies and perhaps different formats, so that many users can stream it simultaneously. Conversely, if the local computing determines that the video is less popular and not viewed by many users, then fewer copies need be stored. The goal is to enable system acceleration, improve the performance of network, storage and compute.

Figure 5:
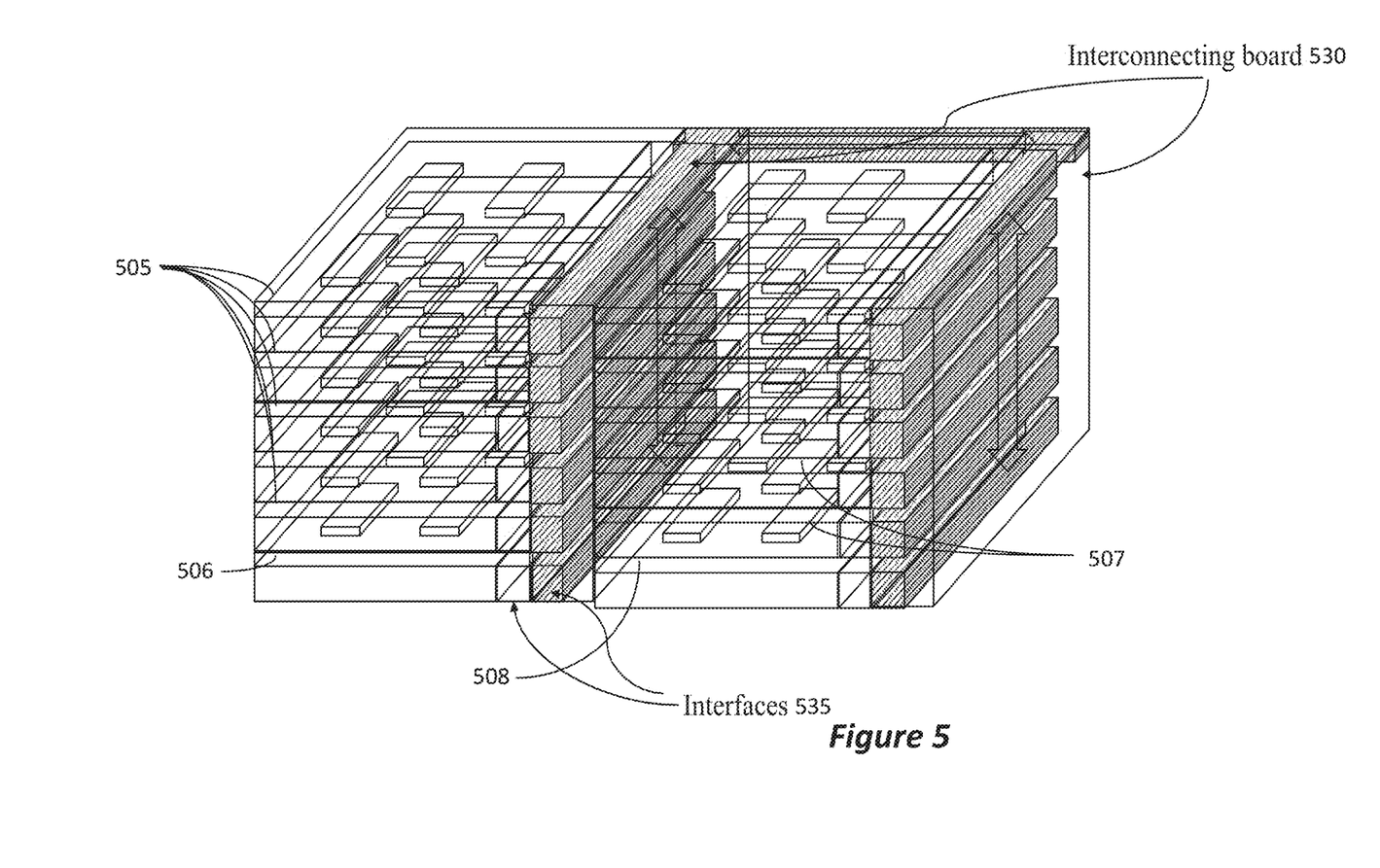
FIG. 5 illustrates an example of a cluster design according to an embodiment.

FIG. 5 illustrates a simplified diagram of a cluster composed of multiple IT containers—here only two shown, but any number may be used. For clarity, the power and cooling modules are not shown in this figure. As illustrated, each IT container is loaded with a plurality of baseboards arranged in rows and columns. For example, five CPU baseboard 505, one GPU baseboard 506, two SSD baseboards 507, and one ASIC baseboard 508 are indicated in one IT container. The remaining baseboards may be of any type and all are connected on their side to interfaces 535, while the interconnecting board 530 is provided on the back and connects between the individual baseboards. The interconnecting board 530 can be understood as a large scale motherboard which is used for connecting all type of communication components, and at the same time, providing interconnection among all the components as necessary. The switch, different speed NICs, optical links, and their corresponding functions, are integrated and realized by the interconnecting board 530. In this manner, a two-dimensional interconnection arrangement is provided, wherein interfaces 535 are provided in one dimension on the side of the baseboards, while the interconnecting board 530 is provided on the back panel of the IT container, forming the second dimension.

Figure 6:
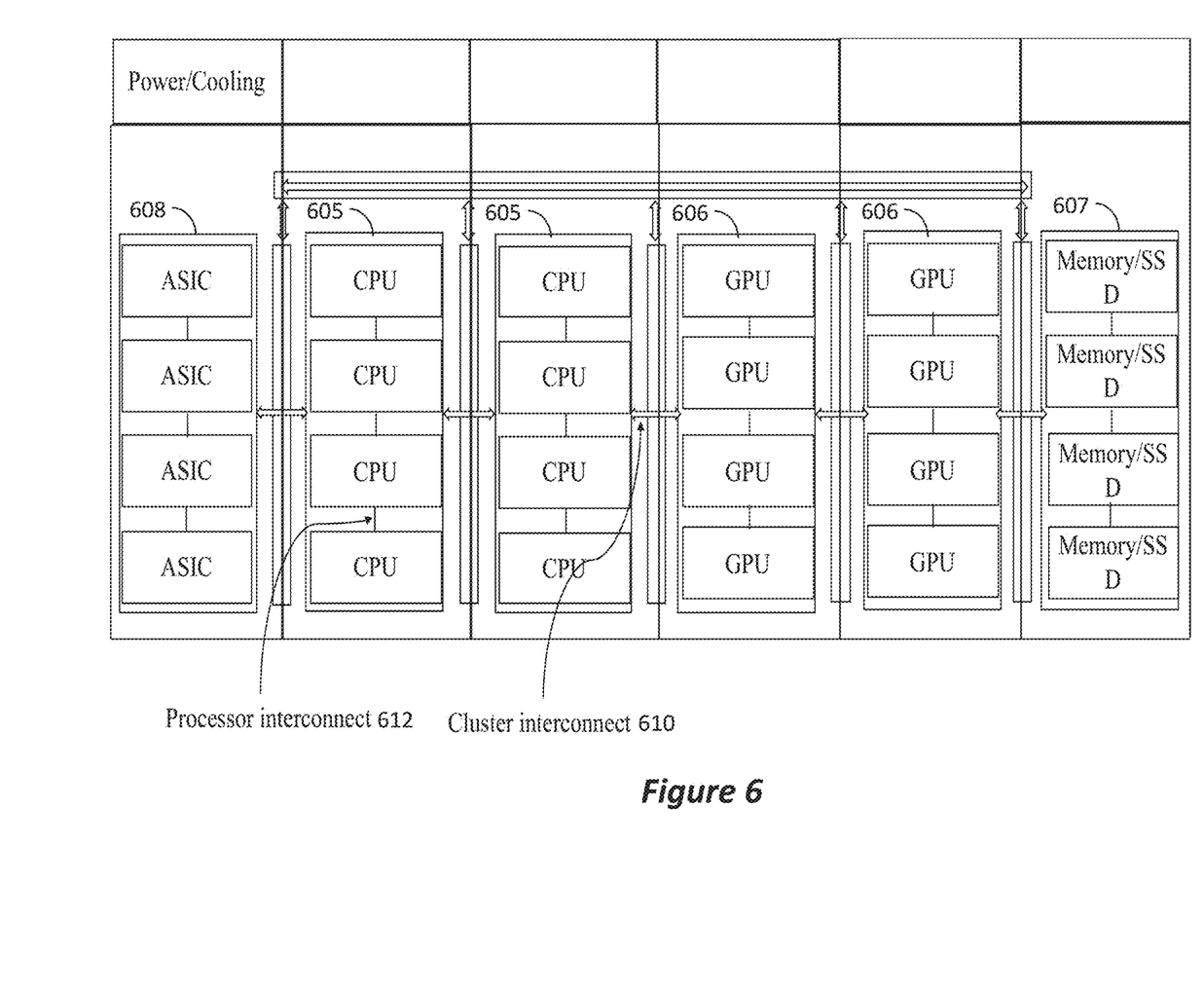

FIG. 6 illustrates an example of a modular heterogeneous computing cluster according to an embodiment. The cluster consists of plurality of baseboards with different types of computing and storage devices, each baseboard having the same components mounted and interconnected within in the baseboard. For simplicity, a small number of baseboards is illustrated in FIG. 6, but it should be understood that the IT container may be structured to house as many baseboards as desired. Moreover, multiple IT containers may be interconnected to form a cluster to add capacity. In another embodiment, multiple clusters can be connected together.

Since all the baseboards have the same form factor and interface, different devices may be mounted on different baseboards of the same type. For example, one or more CPU baseboards 605 may be loaded with a plurality of processors of a first type, each having 16 cores running at 2.1 GHz, while other CPU baseboards may be loaded with a plurality of processors of a second type, each having 32 cores running at 2.0 GHz, while yet other baseboards may be loaded with a plurality of processors of a third type, each having 24 cores running at 2.1 GHz, etc. Similarly, GPU baseboards may be loaded with plurality of AI chips or accelerators, while other GPU baseboards may be loaded with plurality of Intel GPUs, while still other GPU baseboards may be loaded with a plurality of another AI GPU chips or accelerators. Memory Baseboards may also be loaded by different types of memory. E.g., some may have SSD while others may have HDD. The SSD loaded memory baseboards may be of different density and different access speeds.

With the embodiment illustrated in FIG. 6, the cluster can be configured to perform a specific task and then reconfigured to perform a different task, by simply interconnecting the baseboards required to perform the tasks. Moreover, the cluster can be configured to perform different types of operations simultaneously by proper interconnections. For example, a large number of GPU baseboards 606 may be paired with a small number of memory baseboards 607, CPU baseboards 605 and ASIC baseboards 608 to perform tensor calculations, while at the same time, a large number of memory baseboards 607 may be paired with a small number of CPU baseboards 605 to perform backup operations. That is, different baseboards can be paired with other types of baseboards to generate a tailored computing or storage server on the fly.

As indicated, the various compute and storage components can be shared and grouped as needed to perform specific tasks. Similarly, the networking resources can be shared and allocated based on actual workload needs and system burden. For example, if the cluster is doing both offline training and online inferencing, the high performance networking resources maybe controlled and used for the inference activities, which has higher requirement on the latency due to SLA (service-level agreement) requirements, while lower performing networking resources may be assigned to handling the offline training. This can be understood as different interconnecting topologies can be formed using the available network hardware to handle different types of traffic, dynamically.

For example, various types and grades of hardware are mounted onto the interconnecting board. Some of the interfacing components are of high performance type, but of course are the more expensive ones. Therefore, lower performing interfacing components are also included in the interconnecting board in order to lower the overall cost. The various interfacing components may be used for servicing different requirements, as needed. Therefore, the topology may be changed in real time to provide a level of service demanded by different tasks.

As more specific example, during high traffic events, the high performing network resources can be interconnected to service the high traffic requirement—e.g., providing high performing interfacing between the selected GPUs and CPUs. Conversely, during the night there may be a lot of data movement, e.g., for model training, etc. In that case, the topology may change to provide high level service among the accelerators.

Figure 6A:
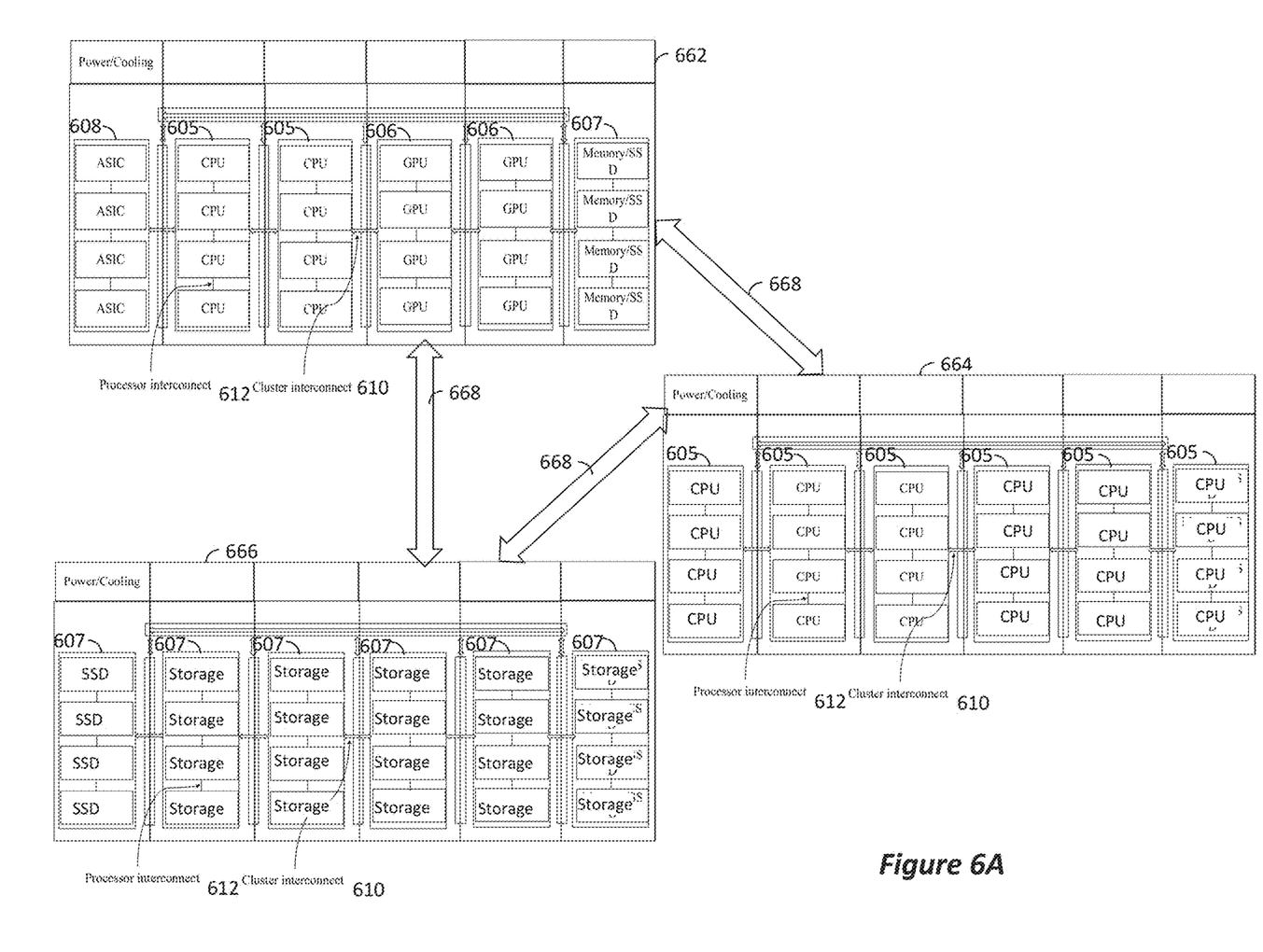
FIG. 6A illustrates an example of component segregation according to an embodiment.

FIG. 6A illustrates another embodiment wherein component segregation may be expanded among different IT containers or even different locations or IT centers. In the example of FIG. 6A, IT container 662 may be assembled according to any of the embodiments disclosed herein, including the embodiment detailed with respect to FIG. 6. Conversely, IT container 664 is loaded solely with CPU baseboards 605, thereby providing enhanced computing capability. On the other hand, IT container 666 is loaded solely with storage baseboards 607, e.g. SSD baseboards, thereby providing expanded storage facility. As illustrated by the double-headed arrows 668, all of the IT containers are interconnected via communication channels, such that each component has access to other components within its IT container or in a different container. Also, as indicated, the IT containers need not reside in the same geographical locations. While, FIG. 6A provides specific examples of loading different IT containers with specific components, other arrangement can be easily provided. Example, an IT container may include only GPU baseboards, only ASIC baseboard, half CPU and half GPU baseboards, etc.

Figure 7:
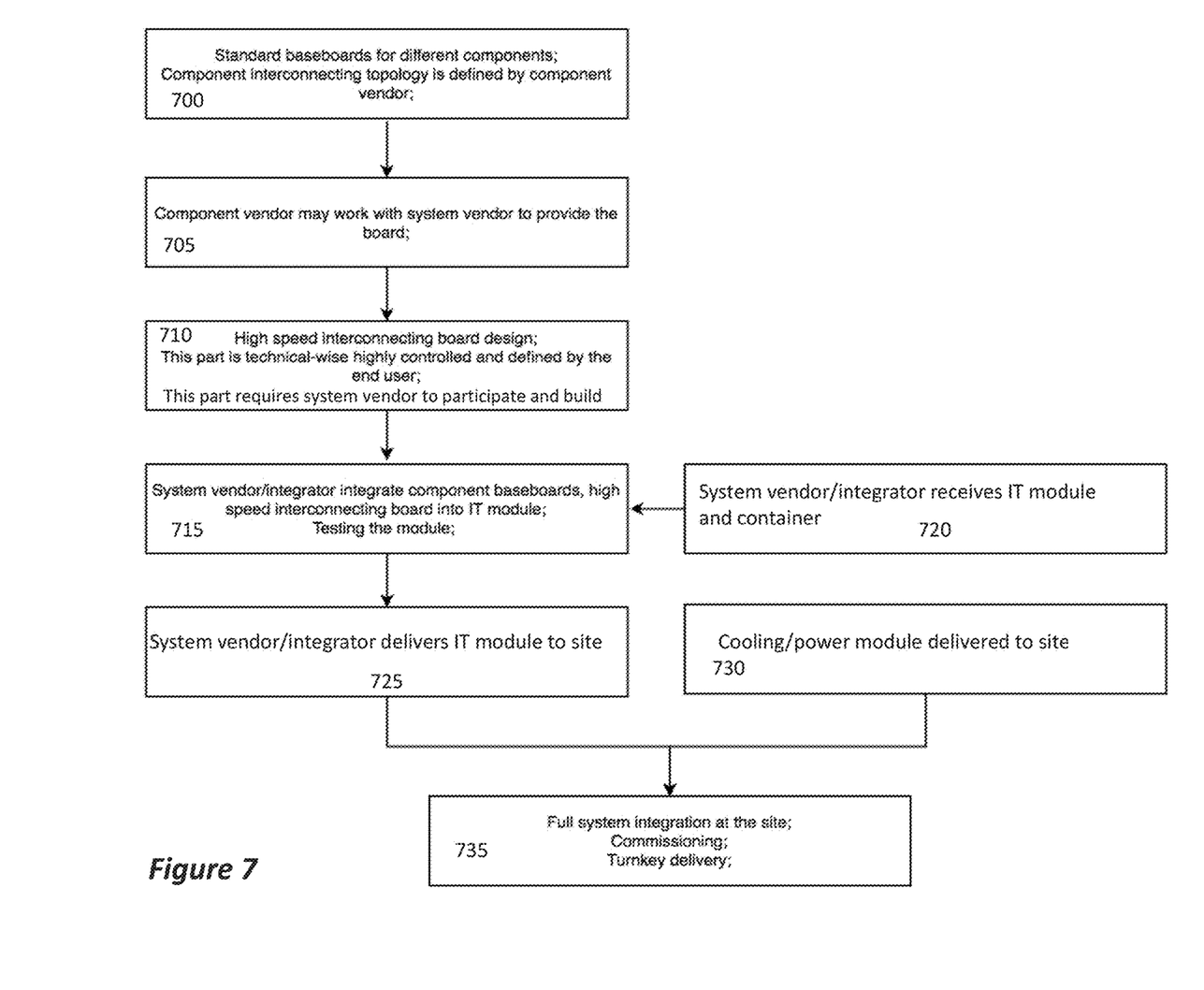
FIG. 7 illustrates a flow chart for system build and delivery according to an embodiment.

FIG. 7 is a flowchart illustrating a process for product development of cluster container according to an embodiment. As noted, all of the baseboards conform to a uniform or standard form factor that defines and prescribes the size, shape, and other physical specifications of the baseboard. However, as indicated in 700, the internal interconnecting topology within each baseboard may be designed differently, as can be defined by different component vendors. For example, one CPU baseboard vendor may define a different interconnecting topology than another CPU vendor. Similarly, the interconnecting topology is different for different types of baseboards, e.g., a CPU baseboard would have a different interconnect topology than an SSD or ASIC baseboard. Also, as noted in 705, the component/baseboard vendor may work with system vendor or integrator to determine the proper design of the baseboard and its interconnects, power requirements, cooling requirements, etc.

The interconnecting boards are used for the cluster level interconnections and, therefore, may be specific to each end-user according to their expected use of the cluster. Depending on the expected interconnection load, different interconnecting boards may be designed with different bandwidth and speed capabilities. In 715 the system vendor or integrator assembles the baseboards and interconnecting board into an operating system using IT container received at 720 from container vendor.

Once system testing is completed at 715 including all the testing and verifications, the system is delivered to the site at 725. In one option, at 720 the integrator also receives various IT modules, possibly including cooling and power modules. Conversely, as illustrated in 730, cooling and power modules may be delivered separately directly to the site. At 735 integration into the site and commissioning are performed. Also, if cooling and power modules were delivered directly to the site, these are integrated into the system at 735.

The owner and operator can dynamically change the boards and IT clusters onsite based on need. That is, even after system delivery and commissioning, at any time the user can easily upgrade, repurpose, or enhance the operating cluster. For example, it may be that the original purpose of the system was to perform a lot of graphic processing and was therefore heavily loaded with GPU baseboards. However, at a later time there may no longer be a high demand for graphic processing, but instead the requirement changed to high CPU processing. In such a case, the user may simply remove a few GPU baseboards and insert instead CPU baseboards. Similarly, it may be that a new generation of CPU becomes available and has an improved performance over the CPU installed in the cluster. The user may then replace some or all of the CPU baseboards with new CPU baseboards loaded with the new generation CPU. In this manner, the system can be maintained to provide the level of performance needed over time, as requirements change and new applications are added which rely on new generation of components. Importantly, since all the components are segregated, the user may replace or upgrade specific components, while leaving the rest of the system as is.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computing and storage system, comprising:
a housing;
power facility provided within the housing;
cooling facility within the housing;
a plurality of slots provided within the housing, each slot having interface connection;
an interconnecting board coupled to the interface connection of the plurality of slots;
a plurality of baseboards, each inserted in one of the slots and having a board interface mating with the interface connection;
wherein all of the baseboards have the same form factor and the same board interface; and,
wherein each of the baseboards has a plurality of electronic devices, and all of the electronic devices mounted onto one of the baseboards are the same.

2. The system of claim 1, wherein the plurality of electronic devices include central processing units (CPU), graphical processing units (GPU), Dual Inline Memory Module (DIMM), solid state drives (SSD), and application specific integrated circuit (ASIC), and wherein the plurality of baseboards include at least one baseboard having a plurality of CPU mounted thereupon and at least one baseboard having a plurality of GPU mounted thereupon.

3. The system of claim 2, wherein each of the baseboards comprises intra-board communication channels.

4. The system of claim 3, wherein the intra-board communication channels form intra-coupling among the plurality of electronic devices mounted on the baseboard, and form inter-coupling between each of the plurality of electronic devices mounted on the baseboard and the board interface.

5. The system of claim 1, wherein the interconnecting board comprises a switch and a plurality of network interface cards (NIC).

6. The system of claim 5, wherein at least two of the NICs operate at different speeds.

7. The system of claim 5, wherein the interconnecting board further comprises a CPU and Field Programmable Gate Array (FPGA).

8. The system of claim 5, wherein the interconnecting board further comprises an interfacing switching module coupled to an interface bus.

9. The system of claim 1, wherein the interconnecting board are configurable for device connection and networking resource allocation and dispatch for different type of traffics and workload.

10. A computing and storage cluster, comprising:
at least two systems having communications channels there-between, each of the systems comprising:
a housing;
power facility and cooling facility provided within the housing;
a plurality of slots provided within the housing, each slot having interface connection;
an interconnecting board coupled to the interface connection of the plurality of slots;

a plurality of baseboards, each inserted in one of the slots and having a board interface mating with the interface connection;

wherein all of the baseboards have the same form factor and the same board interface; and, wherein each of the baseboards has a plurality of electronic devices, and all of the electronic devices mounted onto one of the baseboards are the same.

11. The cluster of claim 10, wherein a first group of baseboards from the plurality of baseboards comprises CPU baseboards, each of the CPU baseboards having a plurality of CPU chips mounted thereupon.

12. The cluster of claim 11, wherein each of the CPU chips comprises a multi-core CPU chip.

13. The cluster of claim 12, wherein a second group of baseboards from the plurality of baseboards comprise GPU baseboards, each of the GPU baseboards having a plurality of graphic processing units mounted thereupon.

14. The cluster of claim 13, wherein a third group of baseboards from the plurality of baseboards comprise memory baseboards, each of the memory baseboards having a plurality of memory chips mounted thereupon.

15. The cluster of claim 14, wherein each of the baseboards comprises intra-board communication channels.

16. The cluster of claim 10, wherein two-dimensional interfacing is provided wherein a first dimension comprises the interface connections to the plurality of baseboards and a second dimension comprises the interconnecting board connections to the interface connections.

17. The cluster of claim 15, wherein the intra-board communication channels form intra-coupling among the plurality of electronic devices mounted on the baseboard, and form inter-coupling between each of the plurality of electronic devices mounted on the baseboard and the board interface.

18. The cluster of claim 10, wherein the interconnecting board comprises a switch and a plurality of network interface cards (NIC).

19. The cluster of claim 18, wherein the interconnecting board further comprises an interfacing switching module coupled to an interface bus.

20. The cluster of claim 19, wherein the interface switching module selectively connects selected network interface cards to selected baseboards forming different type of topologies for different type of traffics and workload.

* * * * *